United States Patent
Holmes et al.

(10) Patent No.: US 11,737,232 B2
(45) Date of Patent: Aug. 22, 2023

(54) UNIVERSAL BRACKET FOR PERIPHERAL DEVICES

(71) Applicant: Dell Products L.P., Round Rock, TX (US)

(72) Inventors: Bruce Anthony Holmes, Austin, TX (US); Maunish A. Shah, Austin, TX (US); Douglas Roy Kaiser, Pflugerville, TX (US); Shree Rathinasamy, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 73 days.

(21) Appl. No.: 17/479,876

(22) Filed: Sep. 20, 2021

(65) Prior Publication Data

US 2023/0101986 A1   Mar. 30, 2023

(51) Int. Cl.
*H05K 7/14* (2006.01)
*G06F 1/18* (2006.01)

(52) U.S. Cl.
CPC .................. *H05K 7/1489* (2013.01); *G06F 1/183* (2013.01)

(58) Field of Classification Search
CPC ........... G06F 1/183; G06F 1/185; G06F 1/186; H05K 7/1489
See application file for complete search history.

(56) References Cited

U.S. PATENT DOCUMENTS

| | | | | |
|---|---|---|---|---|
| 8,480,046 | B2* | 7/2013 | Liu | G06F 1/186 248/225.11 |
| 8,787,011 | B2* | 7/2014 | Peng et al. | G06F 1/186 455/575.8 |
| 8,804,343 | B2* | 8/2014 | Fan et al. | G06F 1/186 361/737 |
| 10,149,415 | B1* | 12/2018 | Svenkeson | H05K 9/0062 |
| 10,381,761 | B2* | 8/2019 | Jau et al. | H01R 12/7082 |
| 10,394,289 | B1* | 8/2019 | Wu et al. | G06F 1/183 |
| 10,871,808 | B2* | 12/2020 | Wiltzius et al. | G06F 1/186 |
| 10,973,139 | B1* | 4/2021 | Tsorng et al. | H05K 7/1424 |
| 11,079,814 | B2* | 8/2021 | Chen et al. | G06F 1/185 |
| 11,537,181 | B1* | 12/2022 | Wang | G06F 1/186 |
| 2012/0170877 | A1* | 7/2012 | Yu et al. | H05K 7/1489 384/21 |
| 2012/0194991 | A1* | 8/2012 | Zhang et al. | G06F 1/186 361/748 |

* cited by examiner

*Primary Examiner* — Eret C McNichols
(74) *Attorney, Agent, or Firm* — Jackson Walker L.L.P.

(57) ABSTRACT

A universal bracket for mechanically coupling an information handling resource to a chassis of an information handling system may include a first mechanical member having a pair of guide features located on opposite edges of the first mechanical member and a second mechanical member having corresponding guide features configured to mechanically couple to the pair of guide features in order to enable the second mechanical member to slide relative to the first mechanical member in a linear direction such that a height of the universal bracket is configurable to match a height of the information handling resource.

17 Claims, 5 Drawing Sheets

UNIVERSAL BRACKET FOR PERIPHERAL DEVICES

TECHNICAL FIELD

The present disclosure relates in general to information handling systems, and more particularly to systems and methods for providing a universal bracket for information handling system components having different form factors.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Increasingly, information handling systems are making use of low-profile components, such as low-profile Peripheral Component Interconnect Express (PCIe) devices, instead of larger "full-height" devices. Such low-profile components may render such components capable of accepting lower cooling airflow requirements relative to their full-height counterparts while still maintaining thermal capabilities.

The form factors of PCIe devices that may be accepted into a slot may vary not only in height (e.g., low-profile or full-height), but may also vary in terms of a number of external ports. For example, network interface cards (NIC) and SmartNICs may include one or more ports for receiving a corresponding network cable. However, other PCIe cards may not have or require network connectivity, and thus may not include any external ports for network connectivity. Thus, numerous devices of various form factors may be received into the same slot. However, a device may be unusable without an appropriate bracket for mechanically affixing the device to an information handling system chassis, wherein such bracket matches the height and slot count of the device. Thus, when switching from one form factor device to another, a user (e.g., an administrator or technician) may also need to replace the bracket used. Replacing the bracket may require significant efforts from the user and a toolkit may also be required as the bracket and device are often coupled using one or more screws or other fasteners.

SUMMARY

In accordance with the teachings of the present disclosure, the disadvantages and problems associated with existing approaches to disposing information handling system components within an information handling system may be reduced or eliminated.

In accordance with embodiments of the present disclosure, a universal bracket for mechanically coupling an information handling resource to a chassis of an information handling system may include a first mechanical member having a pair of guide features located on opposite edges of the first mechanical member and a second mechanical member having corresponding guide features configured to mechanically couple to the pair of guide features in order to enable the second mechanical member to slide relative to the first mechanical member in a linear direction such that a height of the universal bracket is configurable to match a height of the information handling resource.

In accordance with these and other embodiments of the present disclosure, an information handling system may include a chassis, an information handling resource housed within the chassis, and a universal bracket for mechanically coupling the information handling resource to the chassis. The universal bracket may include a first mechanical member having a pair of guide features located on opposite edges of the first mechanical member and a second mechanical member having corresponding guide features configured to mechanically couple to the pair of guide features in order to enable the second mechanical member to slide relative to the first mechanical member in a linear direction such that a height of the universal bracket is configurable to match a height of the information handling resource.

In accordance with these and other embodiments of the present disclosure, a method for forming a universal bracket for mechanically coupling an information handling resource to a chassis of an information handling system may be provided. The method may include mechanically coupling a pair of guide features located on opposite edges of a first mechanical member to a second mechanical member via corresponding guide features of the second mechanical member in order to enable the second mechanical member to slide relative to the first mechanical member in a linear direction such that a height of the universal bracket is configurable to match a height of the information handling resource.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Figure 2A:
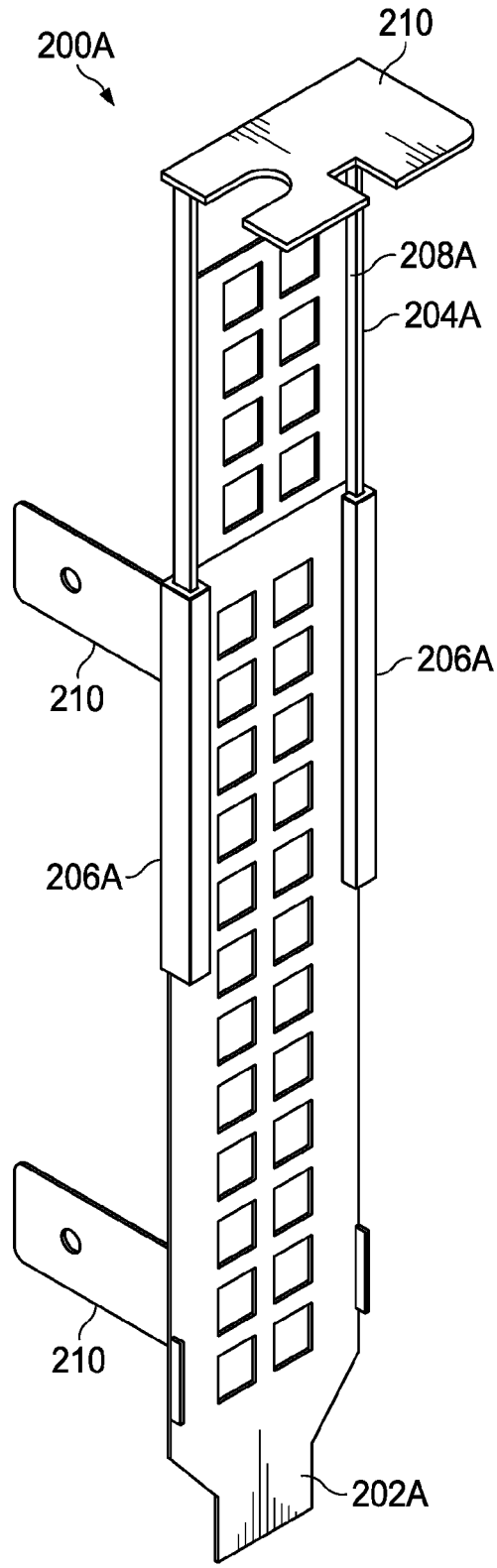
FIGS. 2A and 2B each illustrate an isometric perspective view of an example universal bracket for peripheral devices, the universal bracket without openings for input/output (I/
Figure 2B:
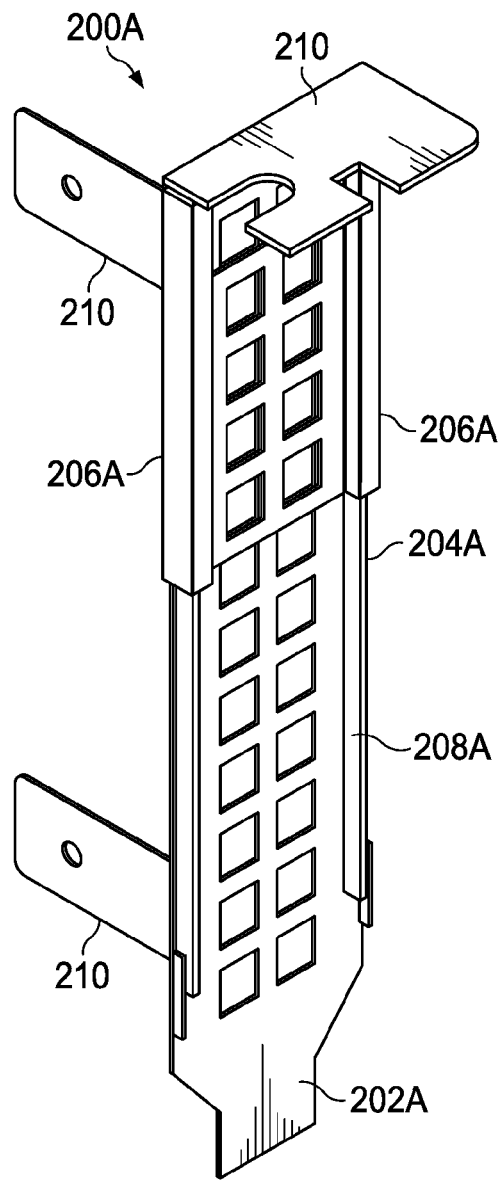
Figure 2C:
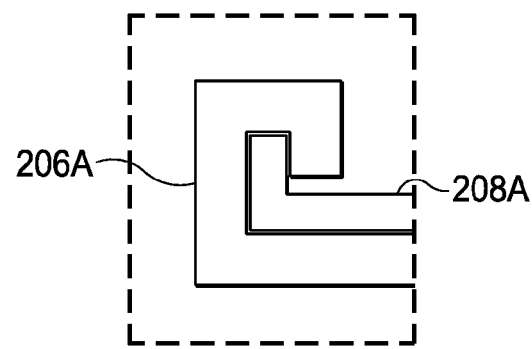
Figure 3A:
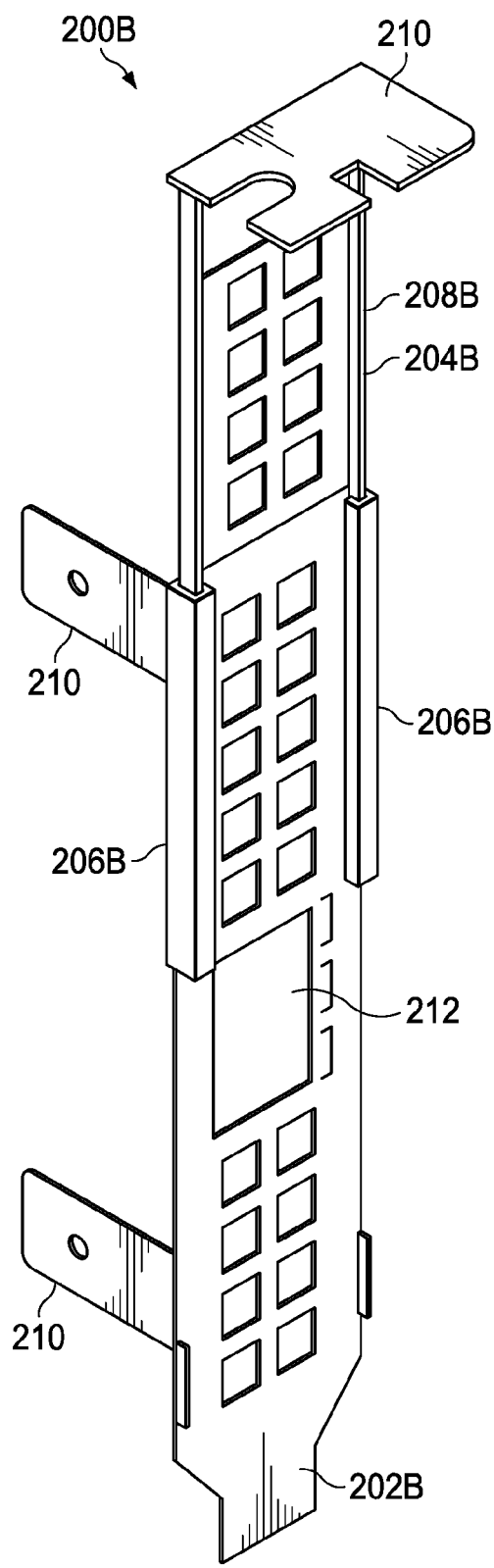
Figure 3B:
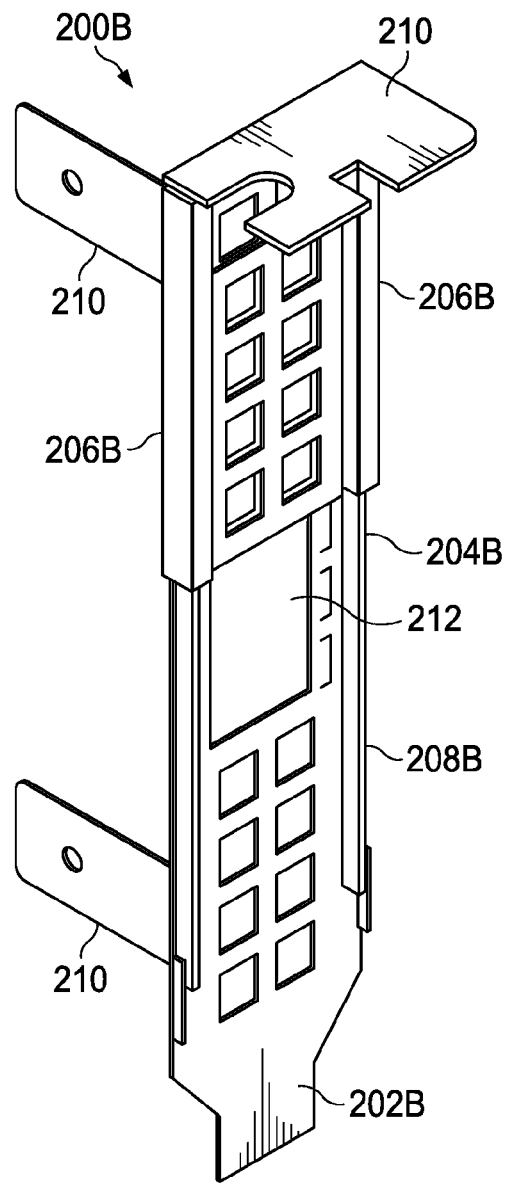
Figure 3C:
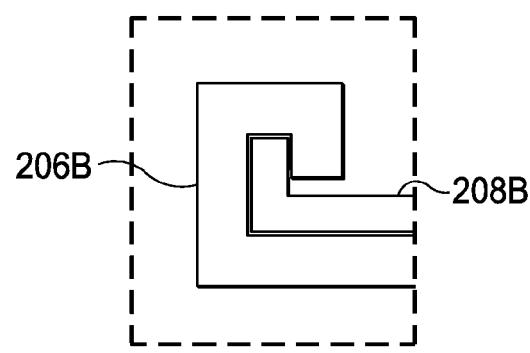
Figure 4A:
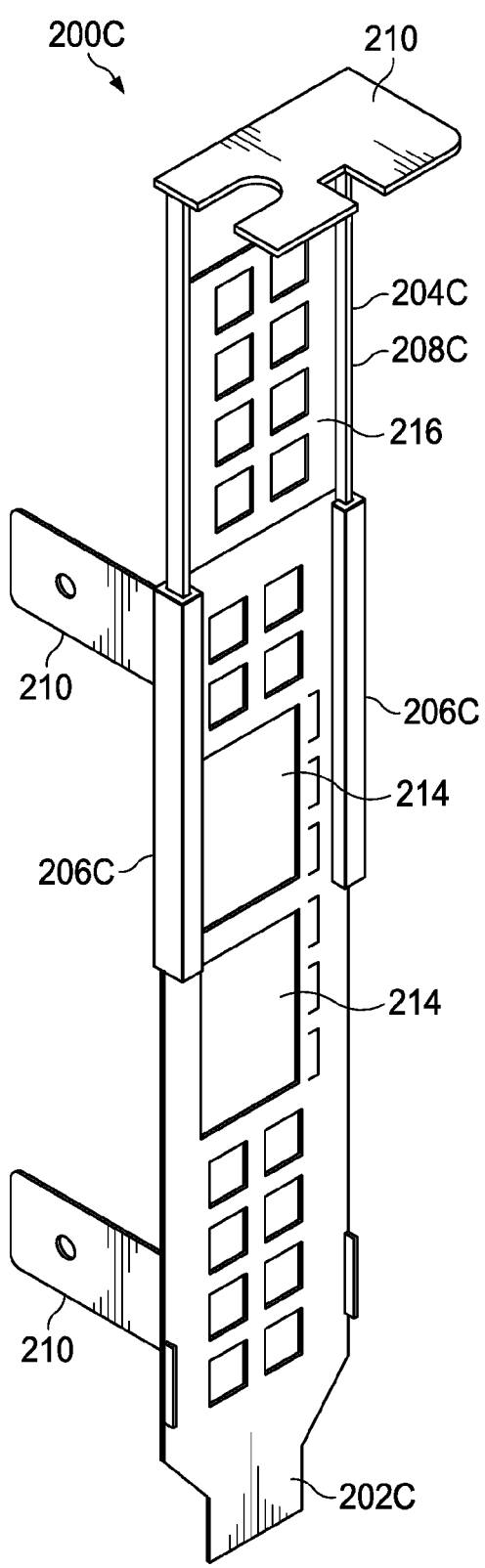
Figure 4B:
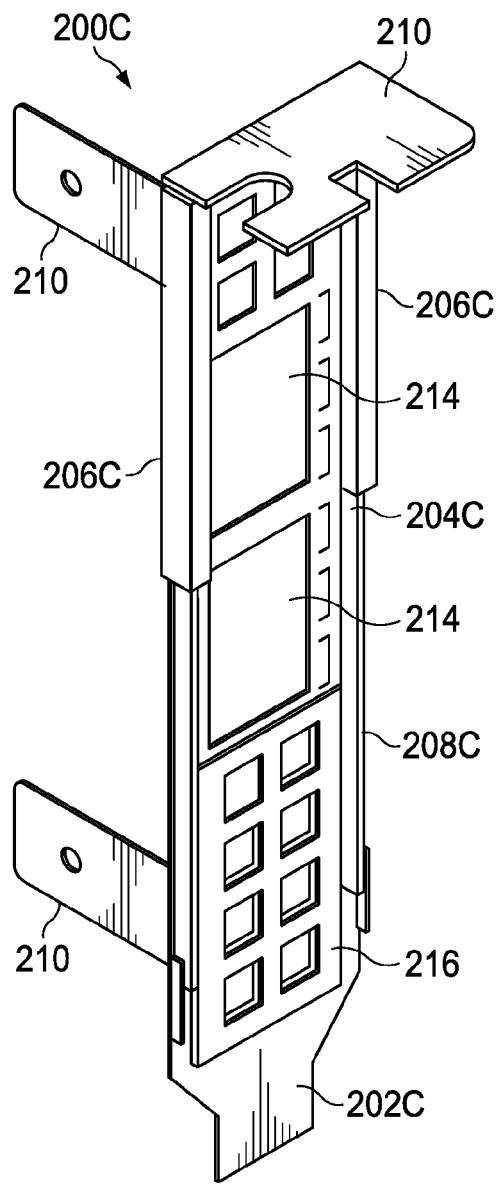
Figure 4C:
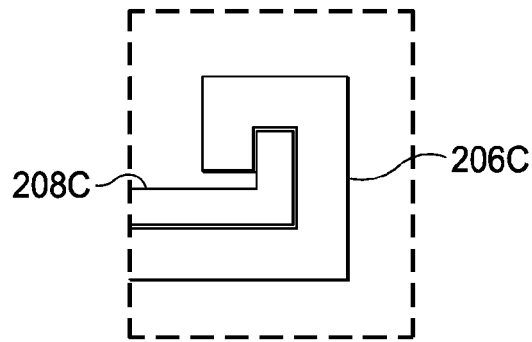
Figure 4D:
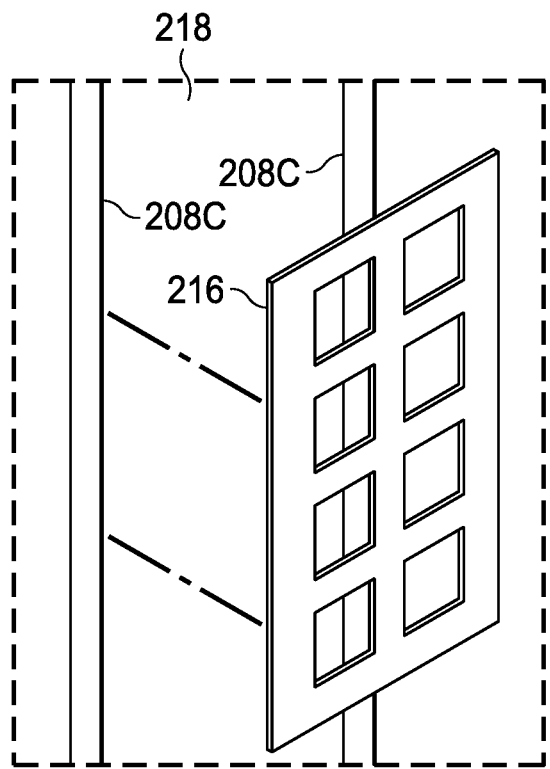
Figure 4E:
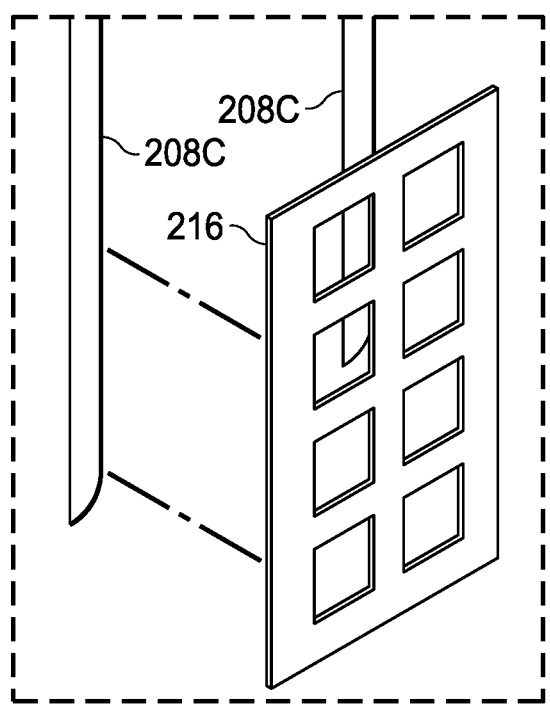

O) ports, in accordance with embodiments of the present disclosure;

FIG. 2C illustrates a cross-sectional view of the example universal bracket of FIGS. 2A and 2B, in accordance with embodiments of the present disclosure;

FIGS. 3A and 3B each illustrate an isometric perspective view of an example universal bracket for peripheral devices, the universal bracket with a single opening for input/output (I/O) ports, in accordance with embodiments of the present disclosure;

FIG. 3C illustrates a cross-sectional view of the example universal bracket of FIGS. 3A and 3B, in accordance with embodiments of the present disclosure;

FIGS. 4A and 4B each illustrate an isometric perspective view of an example universal bracket for peripheral devices, the universal bracket with two openings for input/output (I/O) ports, in accordance with embodiments of the present disclosure;

FIG. 4C illustrates a cross-sectional view of the example universal bracket of FIGS. 4A and 4B, in accordance with embodiments of the present disclosure; and FIGS. 4D and 4E each illustrate a removable section of the example universal bracket of FIGS. 4A and 4B, in accordance with embodiments of the present disclosure.

DETAILED DESCRIPTION

Preferred embodiments and their advantages are best understood by reference to FIGS. 1 through 4E, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal data assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, power supplies, air movers (e.g., fans and blowers) and/or any other components and/or elements of an information handling system.

Figure 1:
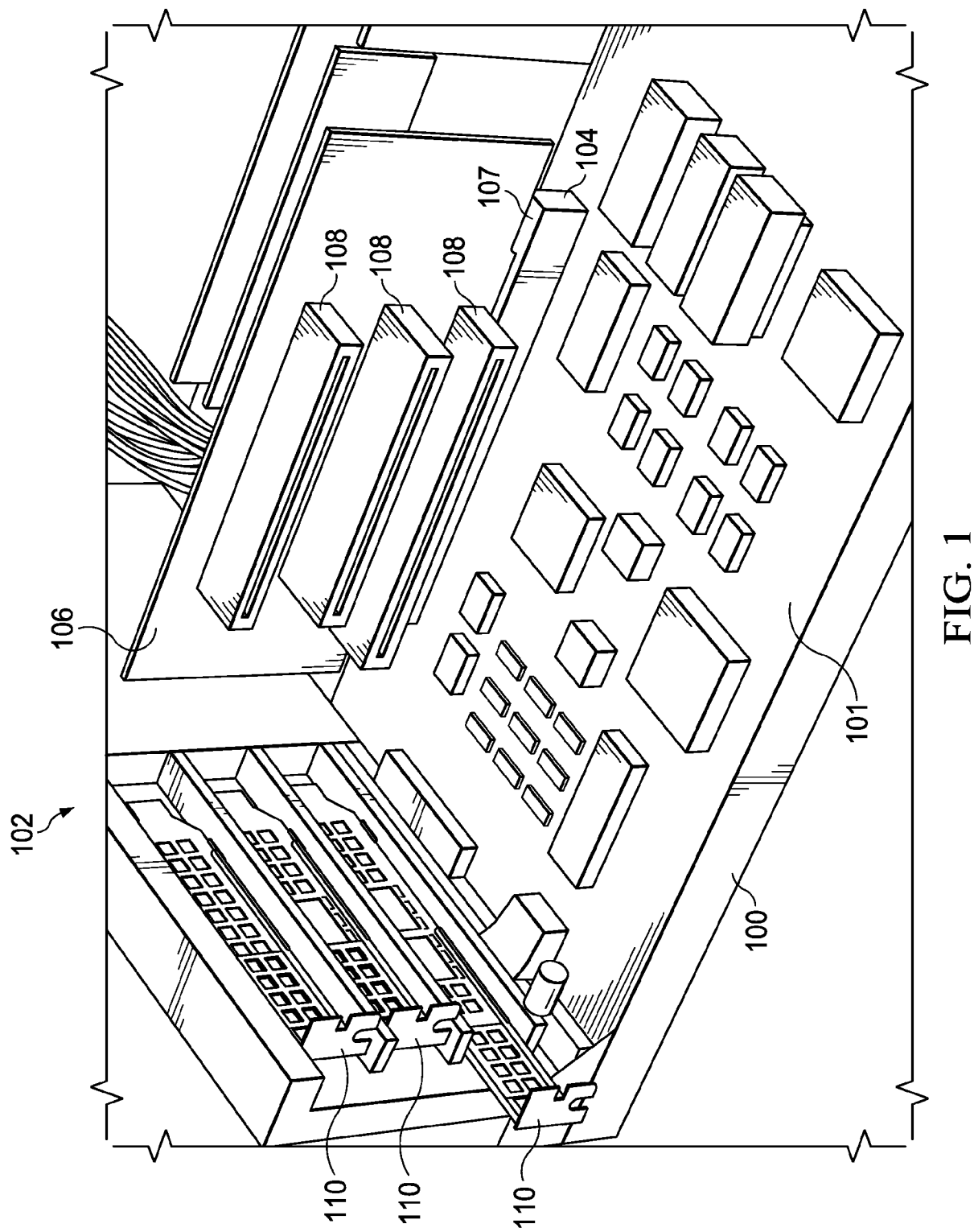
FIG. 1 illustrates an isometric perspective view of an example information handling system, in accordance with embodiments of the present disclosure.

FIG. 1 illustrates an isometric perspective view of an example information handling system 102, in accordance with embodiments of the present disclosure. As depicted, information handling system 102 may include a chassis 100, a motherboard 101, a riser card 106 mechanically and communicatively coupled to motherboard 101, and one or more other information handling resources.

Chassis 100 may be an enclosure that serves as a container for various information handling resources, and may be constructed from steel, aluminum, plastic, and/or any other suitable material. Although the term "chassis" is used, chassis 100 may also be referred to as a sled, case, cabinet, tower, box, enclosure, and/or housing.

Motherboard 101 may include a circuit board mechanically coupled to chassis 100 (e.g., via screws, fasteners, and/or any other mechanical mechanism) and configured to provide structural support for one or more information handling resources of information handling system 102 and/or electrically couple one or more of such information handling resources to each other and/or to other electric or electronic components external to information handling system 102. For example, motherboard 101 may include one or more processors, one or more memories, and one or more other information handling resources. As a specific example, motherboard 101 may have mounted thereon a receptacle connector 104 having mechanical features (e.g., a rigid plastic bracket) and electrically-conductive features (e.g., pins) for receiving a corresponding edge connector (e.g., edge connector 107 of riser card 106), thus electrically coupling electrically conductive traces (e.g., pins) of the edge connector to corresponding electrically-conductive features of receptacle connector 104 and mechanically coupling an information handling resource (e.g., riser 106) to receptacle connector 104 in order to maintain such electrical coupling such that the information handling resource is electrically and communicatively coupled to motherboard 101.

Riser card 106 may comprise a printed circuit board configured to receive a multitude of signal lines (e.g., bused signal lines) via a single connector (e.g., edge connector 107) from motherboard 101 and distribute such signals lines via dedicated connectors (e.g., receptacle connectors 108) mounted on riser card 106. Thus, riser card 106 may enable the addition of expansion cards (e.g., PCIe cards), particularly where a height of chassis 100 does not allow for a perpendicular placement of expansion cards. As shown in FIG. 1, riser card 106 may plug into motherboard 101 (e.g., via edge connector 107) and may provide additional slots, via receptacle connector 108 mounted to riser card 106, for one or more other information handling resources (e.g., PCIe and/or other adapter cards). Accordingly, each receptacle connector 108 may be configured to receive a corresponding edge connector of an information handling resource (e.g., PCIe and/or other adapter card). Consequently, riser card 106 may enable coupling of additional information handling resources in an orientation parallel to motherboard 101, which may save space within chassis 100.

As also depicted in FIG. 1, chassis 100 may comprise one or more brackets 110 each configured to mechanically engage with an information handling resource disposed in a receptacle connector 108 of riser card 106 in order to assist (e.g., along with the receptacle connector 108) in mechanically constraining movement of such information handling resource, in order to ensure proper electrical coupling of such information handling resource to motherboard 101. A bracket 110 may be constructed of any suitable material, including without limitation aluminum or some other metal. As shown in FIG. 1, bracket 110 may be mounted to chassis 100 at or near a wall of chassis 100, such that when mounted to chassis 100, a bracket 110 may serve as at least a partial barrier between the exterior of chassis 100 and the interior of chassis 100. In some embodiments, a bracket 110 may comprise a universal bracket as described below with reference to FIGS. 2A-4C. A universal bracket 200 as shown in any of FIGS. 2A-4C may be used to implement one or more of brackets 110 depicted in FIG. 1.

In addition to motherboard 101 and riser card 106, information handling system 102 may include one or more other information handling resources.

FIGS. 2A and 2B each illustrate an isometric perspective view of an example universal bracket 200A for peripheral devices, universal bracket 200A having no openings for I/O ports, in accordance with embodiments of the present disclosure. FIG. 2C illustrates a cross-sectional view of the example universal bracket 200A, in accordance with embodiments of the present disclosure.

As shown in FIGS. 2A-2C, universal bracket 200A may include a fixed member 202A and a movable member 204A mechanically coupled to fixed member 202A such that movable member 204A may, in response to a mechanical force applied by a user, slide in a linear direction relative to fixed member 202A in a telescoping manner. To facilitate such movement of movable member 204A relative to fixed member 202A and constrain such movement to linear movement, fixed member 202A may include guide features 206A (e.g., C-shaped features when viewing a cross-section of fixed member 202A) on opposite edges of fixed member 202A configured to guide corresponding guide features 208A (e.g., L-shaped features when viewing a cross-section of movable member 204A) present on opposite edges of movable member 204A. Accordingly, a user may be able to apply appropriate mechanical force to universal bracket 200A to modify a height of universal bracket 200A in order to match a height of a corresponding device (e.g., PCIe device) to be inserted into a receptacle connector 108. For example, in a first configuration, a user may set universal bracket 200A to mechanically couple to a full-height device, as shown in FIG. 2A, and in a second configuration, the user may set universal bracket 200A to mechanically couple to a low-profile device, as shown in FIG. 2B.

As also shown in FIGS. 2A and 2B, either or both of fixed member 202A and movable member 204A may include one or more mounting features 210 for mechanically mounting universal bracket 200A to chassis 100 and/or a device using screws, fasteners, and/or another suitable mechanical device.

FIGS. 3A and 3B each illustrate an isometric perspective view of an example universal bracket 200B for peripheral devices, universal bracket 200B having a single opening 212 for I/O ports (e.g., corresponding to a port of a device for coupling to an external network cable), in accordance with embodiments of the present disclosure. FIG. 3C illustrates a cross-sectional view of the example universal bracket 200B, in accordance with embodiments of the present disclosure.

As shown in FIGS. 3A-3C, universal bracket 200B may include a fixed member 202B and a movable member 204B mechanically coupled to fixed member 202B such that movable member 204B may, in response to a mechanical force applied by a user, slide in a linear direction relative to fixed member 202B in a telescoping manner. Opening 212 may be formed in fixed member 202B. To facilitate such movement of movable member 204B relative to fixed member 202B and constrain such movement to linear movement, fixed member 202B may include guide features 206B (e.g., C-shaped features when viewing a cross-section of fixed member 202B) on opposite edges of fixed member 202B configured to guide corresponding guide features 208B (e.g., L-shaped features when viewing a cross-section of movable member 204B) present on opposite edges of movable member 204B. Accordingly, a user may be able to apply appropriate mechanical force to universal bracket 200B to modify a height of universal bracket 200B in order to match a height of a corresponding device (e.g., PCIe device) to be inserted into a receptacle connector 108. For example, in a first configuration, a user may set universal bracket 200B to mechanically couple to a full-height device, as shown in FIG. 3A, and in a second configuration, the user may set universal bracket 200B to mechanically couple to a low-profile device, as shown in FIG. 3B.

As also shown in FIGS. 3A and 3B, either or both of fixed member 202B and movable member 204B may include one or more mounting features 210 for mechanically mounting universal bracket 200B to chassis 100 and/or a device using screws, fasteners, and/or another suitable mechanical device.

FIGS. 4A and 4B each illustrate an isometric perspective view of an example universal bracket 200C for peripheral devices, universal bracket 200C having dual openings 214 for I/O ports (e.g., corresponding to ports of a device for coupling to an external network cable), in accordance with embodiments of the present disclosure. FIG. 4C illustrates a cross-sectional view of example universal bracket 200C, in accordance with embodiments of the present disclosure. FIGS. 4D and 4E each illustrate a removable section 216 of example universal bracket 200C, in accordance with embodiments of the present disclosure.

As shown in FIGS. 4A and 4B, universal bracket 200C may include a fixed member 202C and a movable member 204C mechanically coupled to fixed member 202C such that movable member 204C may, in response to a mechanical force applied by a user, slide in a linear direction relative to fixed member 202C in a telescoping manner. Openings 214 may be formed in fixed member 202C. To facilitate such movement of movable member 204C relative to fixed member 202C and constrain such movement to linear movement, fixed member 202C may include guide features 206C (e.g., C-shaped features when viewing a cross-section of fixed member 202C) on opposite edges of fixed member 202C configured to guide corresponding guide features 208C (e.g., L-shaped features when viewing a cross-section of movable member 204C) present on opposite edges of movable member 204C. Accordingly, a user may be able to apply appropriate mechanical force to universal bracket 200C to modify a height of universal bracket 200C in order to match a height of a corresponding device (e.g., PCIe device) to be inserted into a receptacle connector 108. For example, in a first configuration, a user may set universal bracket 200C to mechanically couple to a full-height device, as shown in FIG. 4A, and in a second configuration, the user may set universal bracket 200C to mechanically couple to a low-profile device, as shown in FIG. 4B.

As also shown in FIGS. 4A and 4B, either or both of fixed member 202C and movable member 204C may include one or more mounting features 210 for mechanically mounting universal bracket 200C to chassis 100 and/or a device using screws, fasteners, and/or other suitable mechanical device.

To address a potential issue of movable member 204C being blocked by a NIC connector cage on a two-port device (or any device with an interfering feature), when converting universal bracket 200C from full-height to low-profile, as shown in FIGS. 4D and 4E, movable member 204C may include a removable section 216 that may be removed from movable member 204C, to create an opening 218 in movable member 204C that may align with openings 214 in the low-profile configuration. Further, after removal, removable section 216 may be reattached to another portion of movable member 204C, such that removable section 216 is available for use in case it is desired to convert universal bracket 200C to full-height again.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A universal bracket for mechanically coupling an information handling resource to a chassis of an information handling system, comprising:
   a first mechanical member having a pair of guide features located on opposite edges of the first mechanical member, wherein each of the pair of guide features has a cross-section that is C-shaped; and
   a second mechanical member having corresponding guide features configured to mechanically couple to the pair of guide features in order to enable the second mechanical member to slide relative to the first mechanical member in a linear direction such that a height of the universal bracket is configurable to match a height of the information handling resource, wherein each of the corresponding guide features has a cross-section that is L-shaped.

2. The universal bracket of claim 1, wherein the first mechanical member and the second mechanical member comprise one or more mounting features for mounting the universal bracket to the chassis and the information handling resource.

3. The universal bracket of claim 1, wherein the first mechanical member has an opening corresponding to an input/output port of the information handling resource.

4. A universal bracket of for mechanically coupling an information handling resource to a chassis of an information handling system, comprising:
   a first mechanical member having a pair of guide features located on opposite edges of the first mechanical member and a plurality of openings corresponding to input/output ports of the information handling resource; and
   a second mechanical member having corresponding guide features configured to mechanically couple to the pair of guide features in order to enable the second mechanical member to slide relative to the first mechanical member in a linear direction such that a height of the universal bracket is configurable to match a height of the information handling resource.

5. The universal bracket of claim 4, wherein the second mechanical member comprising a removable portion configured to be removed from the second mechanical member to prevent interference between the second mechanical member and one or more interfering features of the information handling resource when converting the universal bracket from a first height to a second height.

6. The universal bracket of claim 5, wherein the removable portion may be removed from a first section of the second mechanical member and relocated to a second section of the second mechanical member.

7. An information handling system comprising:
   a chassis;

an information handling resource housed within the chassis; and
a universal bracket for mechanically coupling the information handling resource to the chassis, comprising:
a first mechanical member having a pair of guide features located on opposite edges of the first mechanical member, wherein each of the pair of guide features has a cross-section that is C-shaped; and
a second mechanical member having corresponding guide features configured to mechanically couple to the pair of guide features in order to enable the second mechanical member to slide relative to the first mechanical member in a linear direction such that a height of the universal bracket is configurable to match a height of the information handling resource, wherein each of the corresponding guide features has a cross-section that is L-shaped.

8. The information handling system of claim 7, wherein the first mechanical member and the second mechanical member comprise one or more mounting features for mounting the universal bracket to the chassis and the information handling resource.

9. The information handling system of claim 7, wherein the first mechanical member has an opening corresponding to an input/output port of the information handling resource.

10. An information handling system comprising:
a chassis;
an information handling resource housed within the chassis; and
a universal bracket for mechanically coupling the information handling resource to the chassis, comprising:
a first mechanical member having a pair of guide features located on opposite edges of the first mechanical member and a plurality of openings corresponding to input/output ports of the information handling resource; and
a second mechanical member having corresponding guide features configured to mechanically couple to the pair of guide features in order to enable the second mechanical member to slide relative to the first mechanical member in a linear direction such that a height of the universal bracket is configurable to match a height of the information handling resource.

11. The information handling system of claim 10, wherein the second mechanical member comprises a removable portion configured to be removed from the second mechanical member to prevent interference between the second mechanical member and one or more interfering features of the information handling resource when converting the universal bracket from a first height to a second height.

12. The information handling system of claim 11, wherein the removable portion may be removed from a first section of the second mechanical member and relocated to a second section of the second mechanical member.

13. A method for forming a universal bracket for mechanically coupling an information handling resource to a chassis of an information handling system, comprising:
mechanically coupling a pair of guide features located on opposite edges of a first mechanical member to a second mechanical member via corresponding guide features of the second mechanical member in order to enable the second mechanical member to slide relative to the first mechanical member in a linear direction such that a height of the universal bracket is configurable to match a height of the information handling resource;
wherein:
each of the pair of guide features has a cross-section that is C-shaped; and
each of the corresponding guide features has a cross-section that is L-shaped.

14. The method of claim 13, wherein the first mechanical member has an opening corresponding to an input/output port of the information handling resource.

15. A method for forming a universal bracket for mechanically coupling an information handling resource to a chassis of an information handling system, comprising:
mechanically coupling a pair of guide features located on opposite edges of a first mechanical member to a second mechanical member via corresponding guide features of the second mechanical member in order to enable the second mechanical member to slide relative to the first mechanical member in a linear direction such that a height of the universal bracket is configurable to match a height of the information handling resource;
wherein the first mechanical member has a plurality of openings corresponding to input/output ports of the information handling resource.

16. The method of claim 15, wherein the second mechanical member comprises a removable portion configured to be removed from the second mechanical member to prevent interference between the second mechanical member and one or more interfering features of the information handling resource when converting the universal bracket from a first height to a second height.

17. The method of claim 16, wherein the removable portion may be removed from a first section of the second mechanical member and relocated to a second section of the second mechanical member.

* * * * *

UNITED STATES PATENT AND TRADEMARK OFFICE
CERTIFICATE OF CORRECTION

| | |
|---|---|
| PATENT NO. | : 11,737,232 B2 |
| APPLICATION NO. | : 17/479876 |
| DATED | : August 22, 2023 |
| INVENTOR(S) | : Holmes et al. |

It is certified that error appears in the above-identified patent and that said Letters Patent is hereby corrected as shown below:

In the Claims

In Column 8, Line 41, Claim 4, delete "bracket of for mechanically" and insert -- bracket for mechanically --, therefor.

Signed and Sealed this
Twenty-eighth Day of November, 2023

Katherine Kelly Vidal
*Director of the United States Patent and Trademark Office*